(12) United States Patent
Kim

(10) Patent No.: US 10,304,880 B2
(45) Date of Patent: May 28, 2019

(54) CURVED IMAGE SENSOR

(71) Applicant: SK hynix Inc., Gyeonggi-do (KR)

(72) Inventor: Sang-Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/865,633

(22) Filed: Jan. 9, 2018

(65) Prior Publication Data

US 2019/0006401 A1    Jan. 3, 2019

(30) Foreign Application Priority Data

Jun. 30, 2017 (KR) .................. 10-2017-0083312

(51) Int. Cl.
| H04N 5/225 | (2006.01) |
| H04N 5/369 | (2011.01) |
| H04N 5/374 | (2011.01) |
| H01L 27/146 | (2006.01) |

(52) U.S. Cl.
CPC .... *H01L 27/14607* (2013.01); *H01L 27/1462* (2013.01); *H01L 27/14685* (2013.01); *H04N 5/2253* (2013.01); *H04N 5/2254* (2013.01); *H04N 5/369* (2013.01); *H04N 5/374* (2013.01)

(58) Field of Classification Search
CPC ...... H04N 5/369; H04N 5/374; H04N 5/2253; H04N 5/2254; H01L 27/14607; H01L 27/14685; H01L 27/1462
See application file for complete search history.

(56) References Cited

U.S. PATENT DOCUMENTS

| 7,507,944 | B1* | 3/2009 | Arnzen | ............ H01L 27/14603 250/208.1 |
| 7,547,955 | B2 | 6/2009 | Minamio et al. | |
| 9,490,285 | B2 | 11/2016 | Itonaga | |
| 2009/0115875 | A1* | 5/2009 | Choi | ................. H01L 27/14618 348/294 |
| 2012/0147207 | A1* | 6/2012 | Itonaga | ............. H01L 27/14618 348/222.1 |
| 2016/0086994 | A1* | 3/2016 | Guenter | ............ H01L 27/14625 250/206 |
| 2016/0240582 | A1* | 8/2016 | Yamamoto | ........ H01L 27/14627 |
| 2016/0286102 | A1* | 9/2016 | Sulfridge | ............. H04N 5/2253 |
| 2016/0293429 | A1* | 10/2016 | Keefe | ................... H01L 21/304 |
| 2018/0076257 | A1* | 3/2018 | McKnight | ......... H01L 27/14683 |

FOREIGN PATENT DOCUMENTS

JP      2015-192074      11/2015

* cited by examiner

*Primary Examiner* — Daniel M Pasiewicz

(74) *Attorney, Agent, or Firm* — IP & T Group LLP

(57) ABSTRACT

A curved image sensor includes: a supporting substrate; an image sensor chip formed over the supporting substrate and including a curved light incidence surface; and a flare ghost preventive film formed over the curved light incidence surface and including a planar upper surface.

19 Claims, 8 Drawing Sheets

CURVED IMAGE SENSOR

CROSS-REFERENCE TO RELATED APPLICATIONS

The present application claims priority to Korean Patent Application No. 10-2017-0083312, filed on Jun. 30, 2017, which is incorporated herein by reference in its entirety.

BACKGROUND

1. Field

Exemplary embodiments of the present invention relate to a semiconductor device. Particularly, exemplary embodiments relate to a curved image sensor.

2. Description of the Related Art

An imaging apparatus combining an image sensor and an imaging lens may be formed by disposing the imaging lens on the side of a light incidence surface of the image sensor. Since an aberration of a focus occurs at the center and peripheral area of a sensing surface due to lens aberration, which is called a field curvature, when a subject image is formed through the imaging lens, the imaging apparatus requires a field curvature correction.

To solve this problem, a curved image sensor may be used. In the curved image sensor, a curved side which is curved in three dimensions may be formed corresponding to a curvature of the imaging lens and photoelectric transformation elements are arrayed by using the curved side as a sensing surface or an incidence back side.

However, when curved image sensors are used, a flare ghost phenomenon occurs such that reflected lights produced by mutual reflection between the curved side of the curved image sensor and the imaging lens or an infrared cut-off filter are reflected into an image.

SUMMARY

Embodiments of the present invention are directed to a curved image sensor with improved performance. [NOTE: Please update Summary and Abstract after finalizing the claims. Thank you.]

In accordance with an embodiment of the present invention, a curved image sensor includes: a curved image sensor may comprise a supporting substrate; an image sensor chip formed over the supporting substrate and including a curved light incidence surface; and a flare ghost preventive film formed over the curved light incidence surface and including a planar upper surface.

A lower surface of the flare ghost preventive film may have the same curvature as a curvature of an upper surface of the image sensor chip.

The flare ghost preventive film may fill the image sensor chip from a lowermost upper surface to an uppermost upper surface.

The flare ghost preventive film may include a material whose refractive index may be higher than a refractive index of atmosphere.

The flare ghost preventive film may include a thermosetting material.

The supporting substrate may include a curved portion where the image sensor chip may be formed and a center may be concavely curved; and a supporting portion that contacts both sidewalls on outskirt of the curved portion.

The image sensor chip may be formed over a portion of the supporting portion and the curved portion.

The flare ghost preventive film may be formed over a portion of the curved portion and the image sensor chip.

The flare ghost preventive film may cover an upper portion of the supporting substrate where the image sensor chip may be formed.

In accordance with another embodiment of the present invention, a curved image sensor may comprise an image sensor chip including a curved light incidence surface; a flare ghost preventive film covering the curved light incidence surface and including a planar upper surface; and an infrared cut-off filter formed to contact the planar upper surface of the flare ghost preventive film.

The curved image sensor may further include: a supporting substrate that is formed in a lower portion of the image sensor chip and concavely curved, wherein the supporting substrate may include: a curved portion where the image sensor chip is formed and a center is concavely curved; and a supporting portion that contacts both sidewalls on outskirt of the curved portion.

The image sensor chip may be formed over a portion of the supporting portion and the curved portion.

The flare ghost preventive film may be formed over a portion of the curved portion and the image sensor chip.

The flare ghost preventive film may cover an upper portion of the supporting substrate where the image sensor chip may be formed.

A refractive index of the infrared cut-off filter may be higher than a refractive index of the flare ghost preventive film.

A surface of a lower portion of the flare ghost preventive film adheres to the curved light incidence surface of the image sensor chip, and the curved light incidence surface of the image sensor chip may be fixed by the flare ghost preventive film.

The flare ghost preventive film may include a thermosetting material. The flare ghost preventive film may fill the curved light incidence surface of the image sensor chip from a lowermost surface to an uppermost surface.

A refractive index of the flare ghost preventive film may be higher than a refractive index of atmosphere and lower than a refractive index of the infrared cut-off filter.

DETAILED DESCRIPTION

Figure 1:
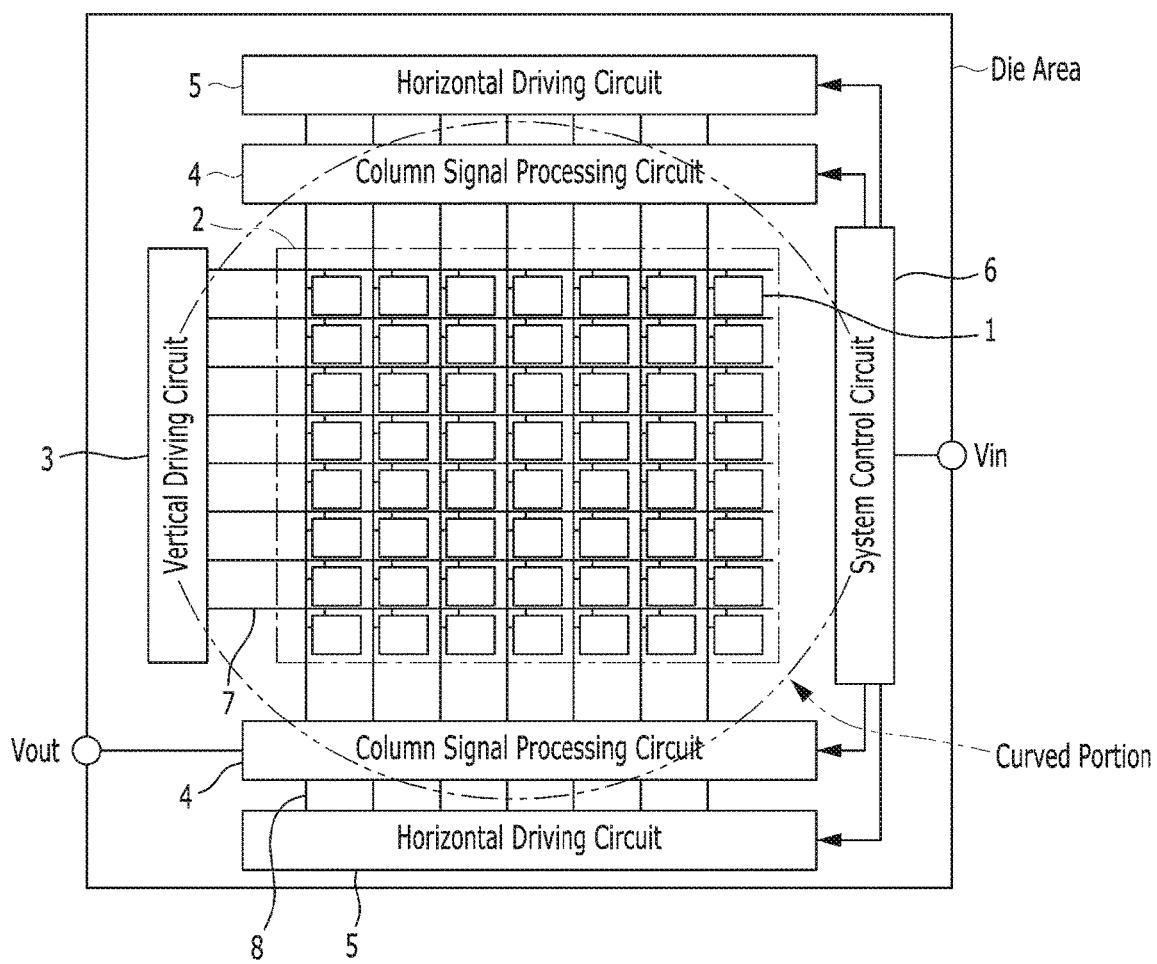
FIG. 1 is a diagram illustrating a structure of a curved image sensor in accordance with embodiments of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a diagram illustrating a structure of a curved image sensor in accordance with embodiments of the present invention. To be specific, FIG. 1 is a plan view illustrating a structure of an image sensor that may be applied to the curved image sensor in accordance with the embodiments of the present invention.

Referring to FIG. 1, the curved image sensor may include a pixel array 2 where a plurality of pixels 1, each of which includes a photoelectric conversion element, are arrayed in two dimensions. Each of the pixels 1 that are arrayed in the pixel array 2 may include a pixel circuit (not shown), which is formed of a plurality of transistors and capacitors, as well as the photoelectric conversion element. The plurality of the photoelectric conversion elements may share a portion of the pixel circuits. Also, the pixel circuit disposed along with the photoelectric conversion element in the pixel 1 may be disposed on an opposite surface to the surface where the photoelectric conversion element is disposed. For example, the pixel circuit in the pixel 1 may be disposed on a plane confronting a light incidence surface where the photoelectric conversion element is disposed.

Peripheral circuits including a vertical driving circuit 3, a column signal processing circuit 4, a horizontal driving circuit 5, and a system control circuit 6 may be disposed around the pixel array 2.

The peripheral circuits may be formed on the substrate that the pixel array 2 is formed. Also, the peripheral circuits may be formed on a substrate that is different from the substrate that the pixel array 2 is formed.

The vertical driving circuit 3 may be formed of a shift register, and the vertical driving circuit 3 may operate the pixels arrayed in the pixel array 2 by units of rows by selecting one among pixel driving lines 7 that are lined to the pixel array 2 and providing a pulse signal for driving pixels to the selected pixel driving line 7. In short, the vertical driving circuit 3 may select and scan the pixels arrayed in the pixel array 2 by units of rows sequentially in the vertical direction. Through vertical signal lines 8 that are lined perpendicularly with respect to the pixel driving lines 7, a pixel signal based on the signal charges generated in response to an amount of light incidence of each pixel may be supplied to the column signal processing circuit 4.

The pixel array 2 may be formed in a die area. An image sensor chip in accordance with an embodiment of the present invention may be curved concavely in the die area and image sensor chips formed in an area other than the die area are not curved.

The column signal processing circuit 4 may be disposed at each column of pixels, and the column signal processing circuit 4 processes a signal (e.g., noise removal) of each pixel column by units of rows. For example, the column signal processing circuit 4 may perform signal processing, such as Correlated Double Sampling (CDS) for removing fixed pattern noise, and may also perform signal processing such as signal amplification and analog-to-digital conversion (ADC).

The horizontal driving circuit 5 may be formed of a shift register, and may sequentially select the column signal processing circuits 4 and output a pixel signal from each of the column signal processing circuits 4 by sequentially outputting horizontal scan pulses.

An output circuit may perform a signal processing onto the signals that are sequentially supplied from the column signal processing circuits 4 and output resultant signals. For example, the output circuit may perform buffer operation only, or it may perform other diverse digital signal processing such as brightness adjustment and row deviation correction.

The system control circuit 6 may receive an input clock and data for directing an operation mode and output data such as internal image sensor information. In other words, the system control circuit 6 may generate a clock signal or a control signal that becomes a reference for the operations of the vertical driving circuit 3, the column signal processing circuit 4, and the horizontal driving circuit 5 based on a vertical synchronization signal, a horizontal synchronization signal, and a master clock. The system control circuit 6 may input the generated signal into the vertical driving circuit 3, the column signal processing circuit 4, and the horizontal driving circuit 5.

Figure 2A:
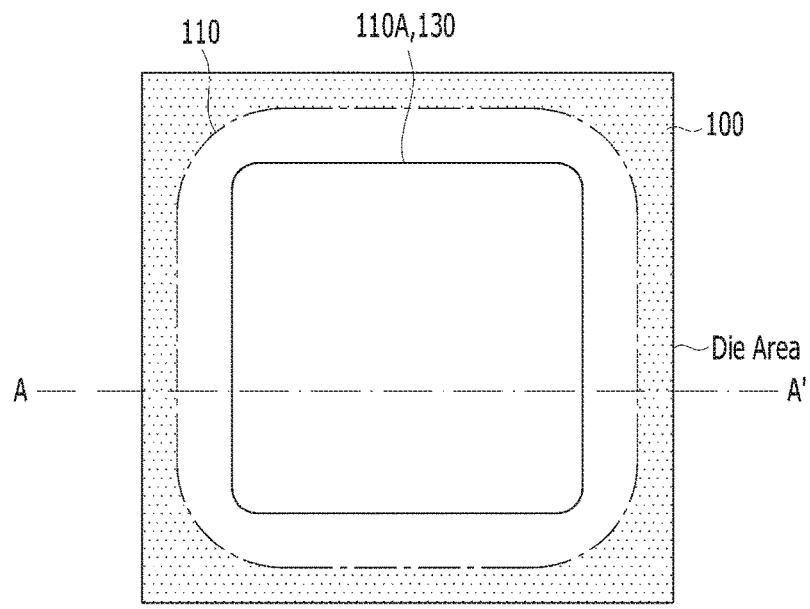
FIGS. 2A, 2B and 2C are diagrams illustrating a curved image sensor in accordance with an embodiment of the present invention.
Figure 2B:
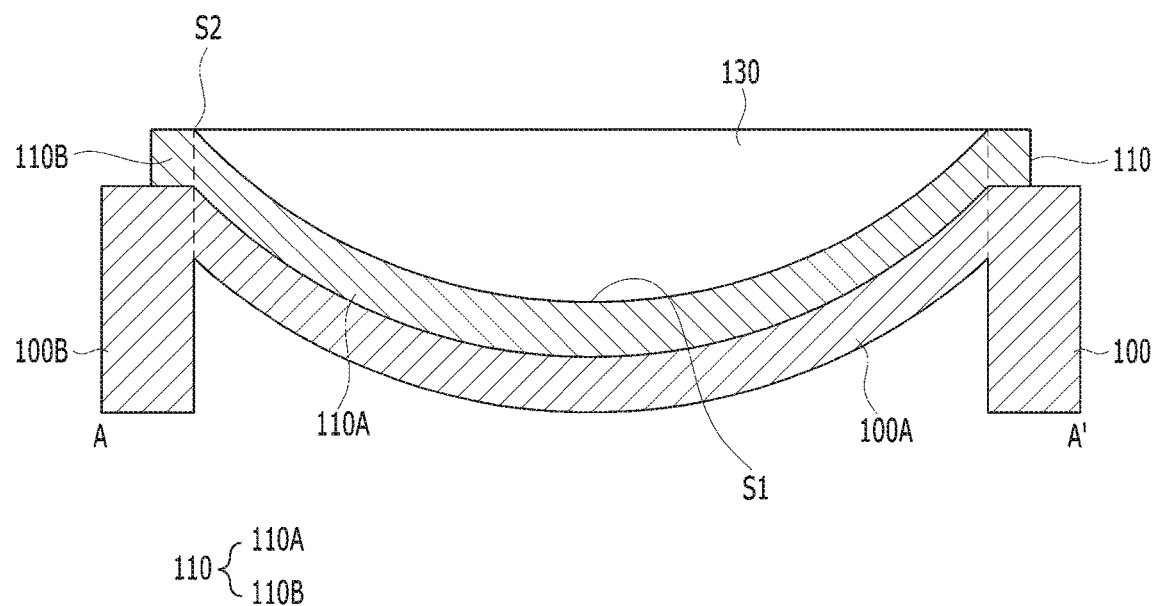
Figure 2C:
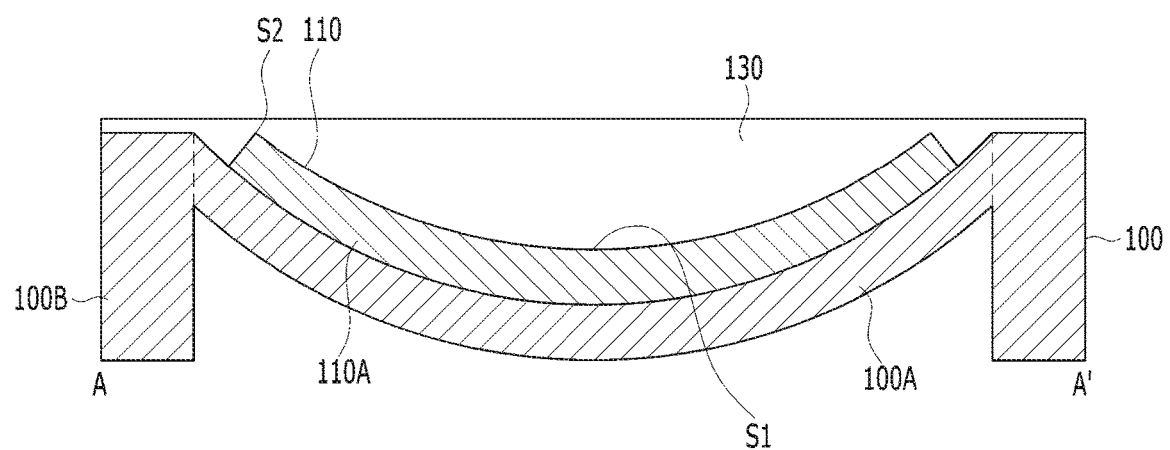
Figure 3:
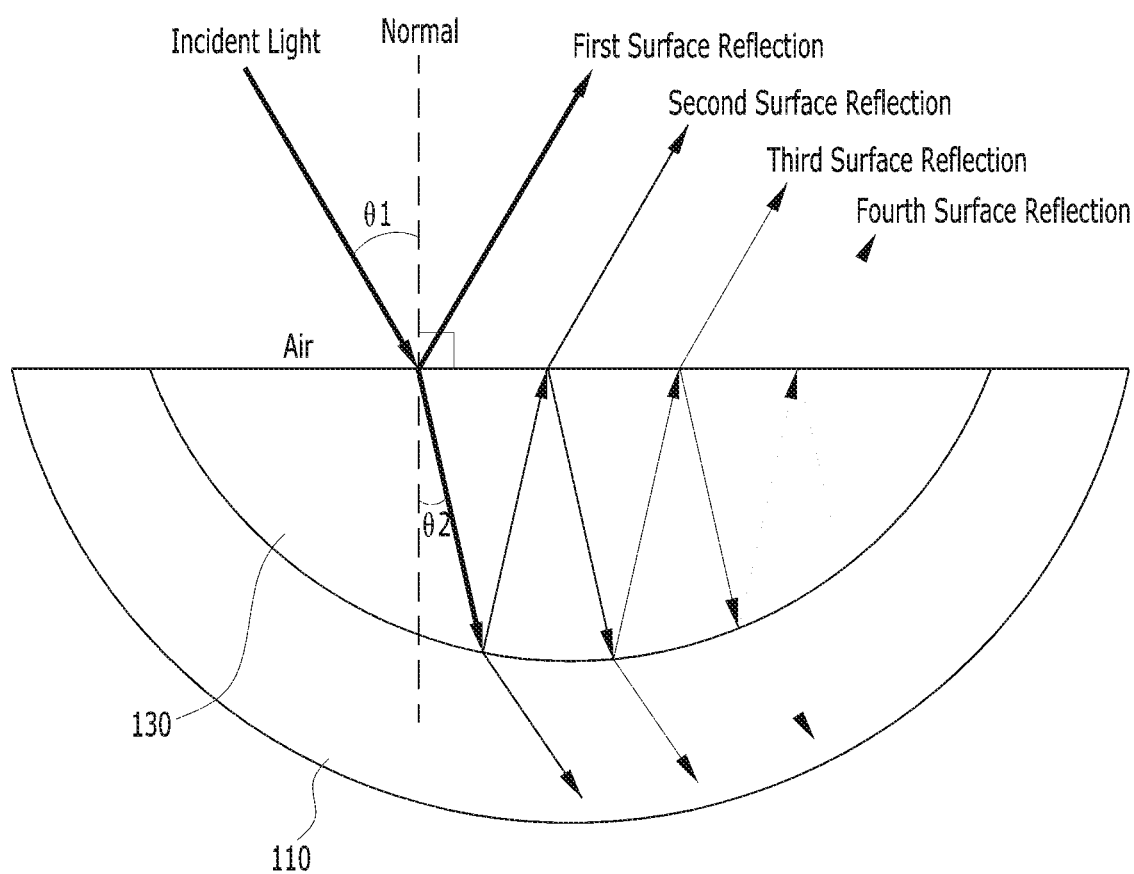
FIG. 3 is a diagram illustrating a refractive index and reflection ratio of light.

FIGS. 2A, 2B and 2C are diagrams illustrating a curved image sensor in accordance with an embodiment of the present invention. FIG. 2A is a plan view, and FIGS. 2B and 2C are cross-sectional views taken along a line A-A' shown in FIG. 2A. FIG. 3 is a diagram illustrating a refractive index and reflection ratio of light.

Referring to FIGS. 2A and 2B, the curved image sensor may include a supporting substrate 100, an image sensor chip 110, and a flare ghost preventive film 130. The image sensor chip 110 may be formed over the supporting substrate 100 and have a curved light incidence surface. The flare ghost preventive film 130 may be formed over the curved light incidence surface of the image sensor chip 110 and have a planar upper surface.

The supporting substrate 100 may be a carrier wafer or a handle wafer. The image sensor chip 110 may include a device wafer or it may be separated from a device wafer. The supporting substrate 100 and the image sensor chip 110 may include a semiconductor substrate. The semiconductor substrate may be of a monocrystalline state, and it may include a silicon-containing material. In short, the supporting substrate 100 and the image sensor chip 110 may include a monocrystalline silicon-containing material. For example, the supporting substrate 100 and the image sensor chip 110 may be a bulk silicon substrate.

When the image sensor is of a back-side illumination type, the upper surface of the image sensor chip 110 may be a back side thereof as a light incidence surface, and the lower surface thereof, which confronts the upper surface, may be a front side thereof.

Although not illustrated herein, the curved image sensor may further include an inter-layer dielectric layer that is formed on the lower surface of the image sensor chip 110, which is the front side of the image sensor chip 110, and may include a signal generation circuit. The inter-layer dielectric layer may be a single layer selected from a group including an oxide layer, a nitride layer, and an oxynitride layer, or a multi-layer of two or more of the layers listed above.

The signal generation circuit that is formed in the inside of the inter-layer dielectric layer may include a plurality of transistors, multiple layers of metal lines, and a plurality of contact plugs that couple the transistors and the metal lines to each other. Herein, the signal generation circuit may include the pixel circuit and the peripheral circuits that are mentioned above by referring to FIG. 1.

Also, color filters may be formed to correspond to the photoelectric conversion elements, respectively, over the upper surface (i.e., the back side) of the image sensor chip 110 and a micro lens that is formed over the color filters.

Each of the photoelectric conversion elements may include a photo diode. The photoelectric conversion element may be formed in the image sensor chip 110. For example, the photoelectric conversion element may include one or more photoelectric converters that are formed in the image sensor chip 110 and vertically overlap with each other. Each of the photoelectric converter may include a P-type impurity region and an N-type impurity region.

Also, the supporting substrate 100 may include a curved portion 100A that is curved concavely toward the center of the die area and a supporting portion 100B that contacts the sidewalls on the outskirt of the curved portion 100A. The curved portion 100A may include a curved lower surface and a curved upper surface.

The image sensor chip 110 may include an image sensor chip curved portion 110A that is curved concavely toward the center of the die area. The image sensor chip curved portion 110A may include a lower surface and an upper surface that are concavely curved, and a light incidence surface may be formed on the curved upper surface. Also, the image sensor chip 110 may be formed to cover the upper surface of the image sensor chip curved portion 110A of the supporting substrate 100.

The flare ghost preventive film 130 may be formed of a thermosetting material which has transparency with respect to visible light and may have a higher refractive index than that of the atmosphere. For example, the flare ghost preventive film 130 may include a polyimide, polystyrene, or polyhydroxy styrene-based material. Since the flare ghost preventive film 130 is formed of a transparent material, the flare ghost preventive film 130 may transmit the light to the image sensor chip 110 without lowering the transmission rate of visible light and loss of light energy due to scattering.

Also, the flare ghost preventive film 130 formed in the upper portion of the image sensor chip 110 may prevent the flare ghost phenomenon, which is caused when a reflection light produced as incident light entering from the outside is reflected by the image sensor chip 110 re-enters into the inside of the image sensor chip 110 by guiding the reflection light to the outside of the image sensor chip 110 through the planar upper surface of the flare ghost preventive film 130.

Also, as illustrated in FIG. 3, when an incident light having an incidence angle $\Theta 1$ enters through the atmosphere the flare ghost preventive film 130, whose refractive index may be higher than the refractive index of the atmosphere, the incident light may be refracted toward a normal at a refraction angle $\Theta 2$ which is smaller than the incidence angle $\Theta 1$ and transmitted into the image sensor chip 110, which increases gathering power of the incident light to the image sensor chip 110 and thus increases optical characteristics of the incident light.

Also, since the flare ghost preventive film 130 is formed over the curved upper surface of the image sensor chip 110 and has the same curvature as that of the upper surface of the image sensor chip 110, the image sensor chip 110 may maintain the curved shape. Also, since the flare ghost preventive film 130 is formed of a material having thermosetting characteristics filling the image sensor chip 110 from the lowermost upper surface S1 to the uppermost upper surface S2 of the image sensor chip 110, the curved shape of the image sensor chip 110 may be more effectively maintained.

Also, as illustrated in FIG. 2C, the flare ghost preventive film 130 may be formed to cover the upper portion of the supporting substrate 100 where the image sensor chip 110 is not formed. The image sensor chip 110 may be formed to have its upper surface positioned at the same level as or at a lower level than the upper surface of the curved portion 100A of the supporting substrate 100.

FIGS. 4A to 4E are diagrams illustrating a method for fabricating a curved image sensor in accordance with an embodiment of the present invention. Herein, an example of a method for fabricating the curved image sensor in accordance with the above-described embodiment of the present invention will be described. FIGS. 4A to 4E are perspective views illustrating a cross-section of the curved image sensor taken along the line A-A'.

Figure 4A:
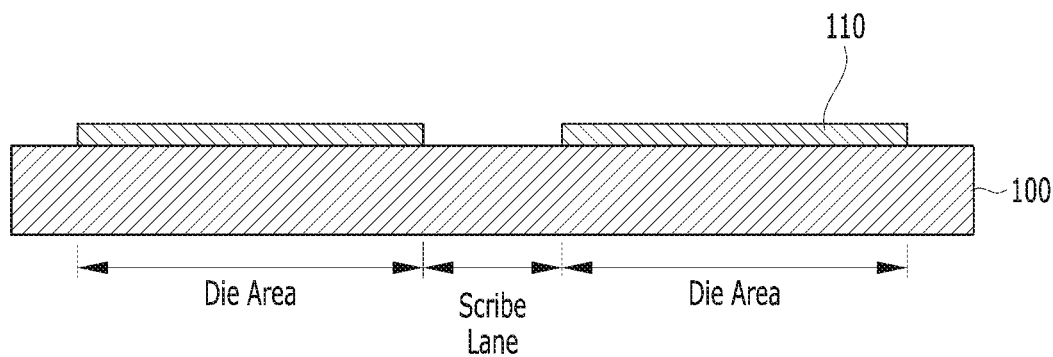
FIGS. 4A to 4E are diagrams illustrating a method for fabricating a curved image sensor in accordance with an embodiment of the present invention.

Referring to FIG. 4A, the image sensor chip 110 may be prepared by bonding onto the supporting substrate 100 having a plurality of die areas and scribe lanes.

Figure 4B:
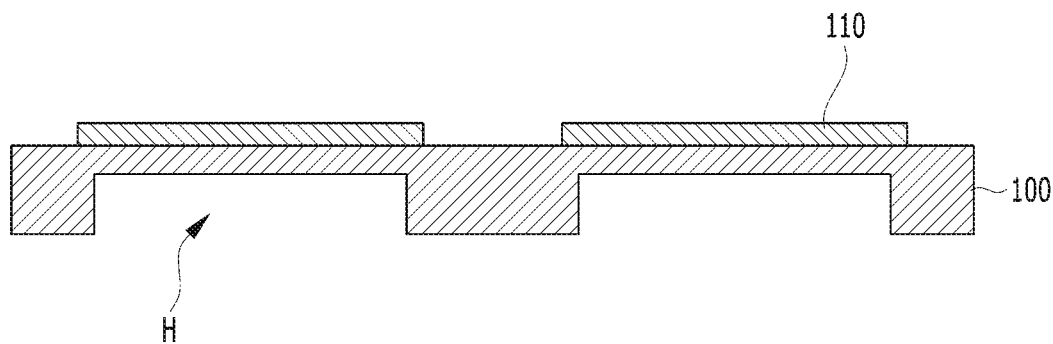

Referring to FIG. 4B, a groove H that overlaps with the image sensor chip 110 may be formed by removing a portion of the back side of the supporting substrate 100. Herein, the center of the image sensor chip 110 may coincide with the center of the groove H. To be specific, the center of the groove H may be formed to be positioned in the center of the pixel array where a plurality of pixels are arrayed in two dimensions in the die areas. This is to form a curved light incidence surface having a constant curvature in subsequent processes.

Figure 4C:
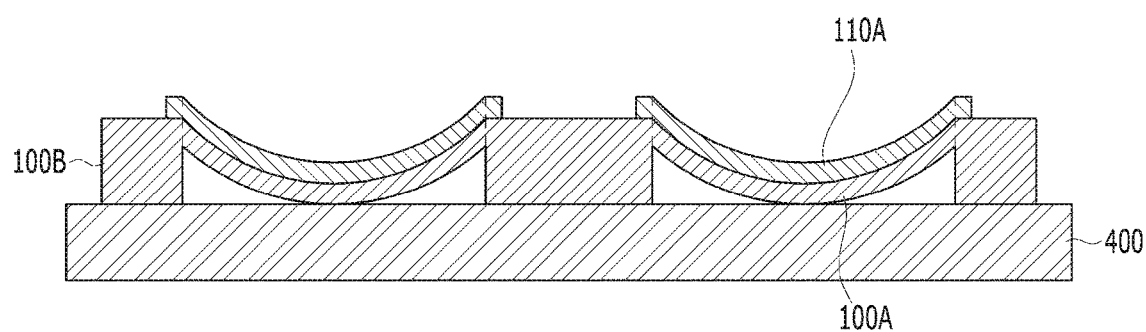

Referring to FIG. 4C, the structure formed in FIG. 4B is disposed over a chamber substrate 400 in the inside of a vacuum chamber, and the atmospheric pressure in the inside of the groove H may be maintained at a level of 1 atmospheric pressure (that is, the pressure of the air) by sealing the groove H airtight by using the chamber substrate 400 and the supporting substrate 100.

Subsequently, the image sensor chip 110 disposed in the die area and the overall area of the supporting substrate 100 may be concavely curved in a uniform hemispheric shape by decreasing the pressure in the inside of the groove H from the 1 atmospheric pressure into 2 atmospheric pressure. In short, the present invention may control the atmospheric pressure in the inside of the groove H and the atmospheric pressure in the inside of the vacuum chamber, and may adjust the degree of curvature of the image sensor chip 110 and the supporting substrate 100. In this way, the present invention may improve the precision of matching the center of the die area and the optical center of the imaging lens with each other and decrease lens aberration by curving the surface of the imaging portion.

Through the process, the supporting substrate 100 may include the curved portion 100A that is curved concavely toward the center of the die area and the supporting portion 100B that contacts the sidewalls on the outskirt of the curved portion 100A. The curved portion 100A may include a curved lower surface and a curved upper surface.

Also, the image sensor chip 110 may include an image sensor chip curved portion 110A that is curved concavely toward the center of the die area, and a light incidence surface may be formed on the curved upper surface.

Figure 4D:
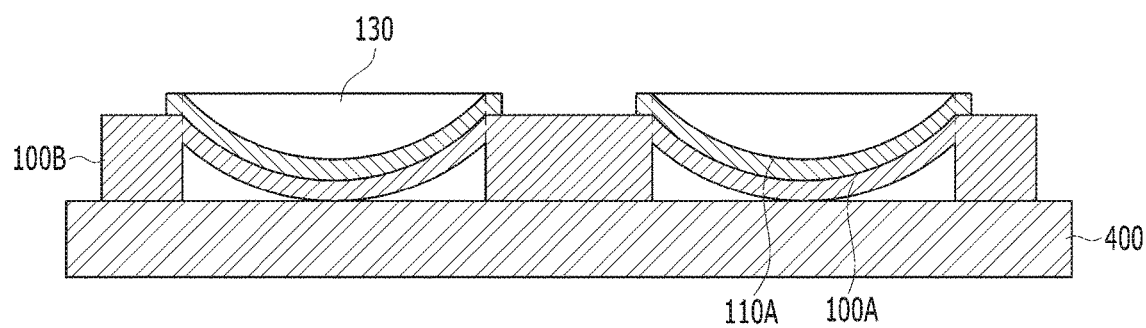

Referring to FIG. 4D, a preliminary flare ghost preventive film 130A may be formed in the upper portion of the curved image sensor chip 110. The preliminary flare ghost preventive film 130A may include a planarization material, and it may be formed through a spin-coating method to cover all the upper portions of the image sensor chip 110 and the supporting substrate 100. Also, a curing process may be performed to fix the shape of the preliminary flare ghost preventive film 130A. As a result, the flare ghost preventive film 130 that adheres to the curved incidence side and has a planar upper surface may be formed.

The flare ghost preventive film 130 may be formed of a thermosetting material which has transparency with respect to visible light and has a higher refractive index than that of the atmosphere. For example, the flare ghost preventive film 130 may include a polyimide, polystyrene, or polyhydroxy styrene-based material.

Figure 4E:
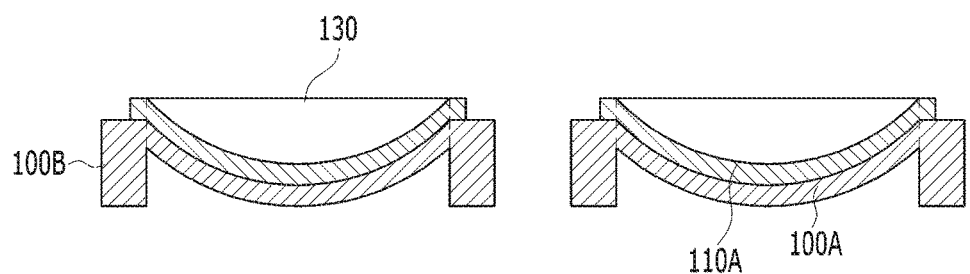

Referring to FIG. 4E, a sawing process may be performed to separate the supporting substrate 100 along a scribe lane. The sawing process may be performed onto the supporting substrate 100 and/or the image sensor chip 110. After the sawing process, the chamber substrate 400 may be removed. Hereafter, a curved image sensor including the supporting substrate 100 that is separated through the sawing process and the image sensor chip 110 may be fabricated.

Although not illustrated in the drawings, a filling agent for filling the groove H formed on the back side of the supporting substrate 100 may be further formed.

Figure 5A:
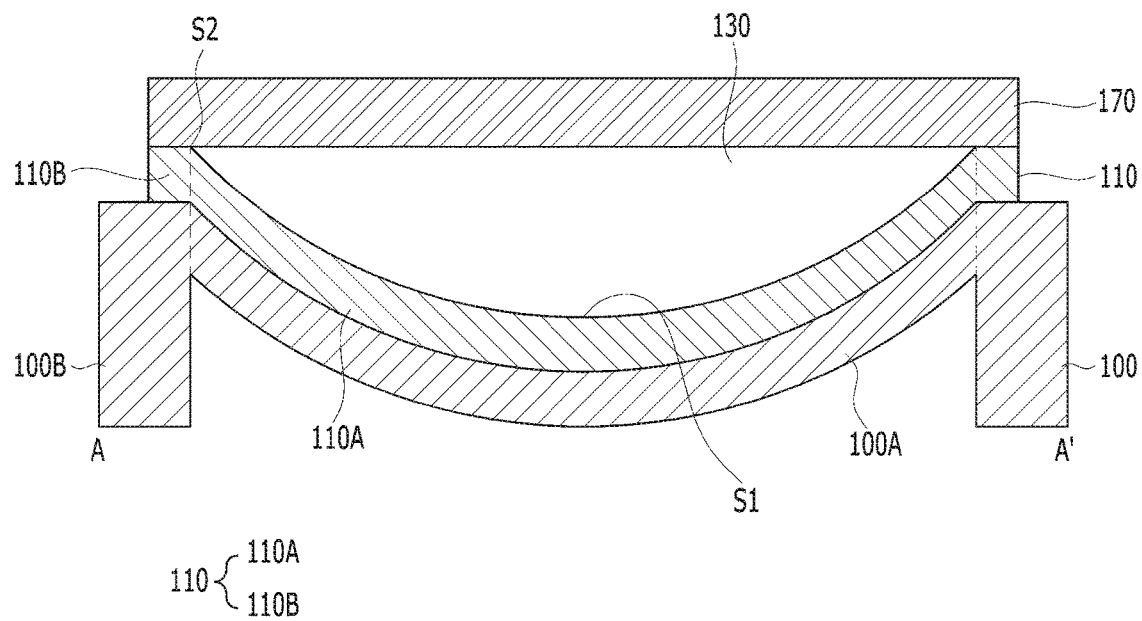
FIGS. 5A and 5B are diagrams illustrating an example of the curved image sensor in accordance with an embodiment of the present invention.
Figure 5B:
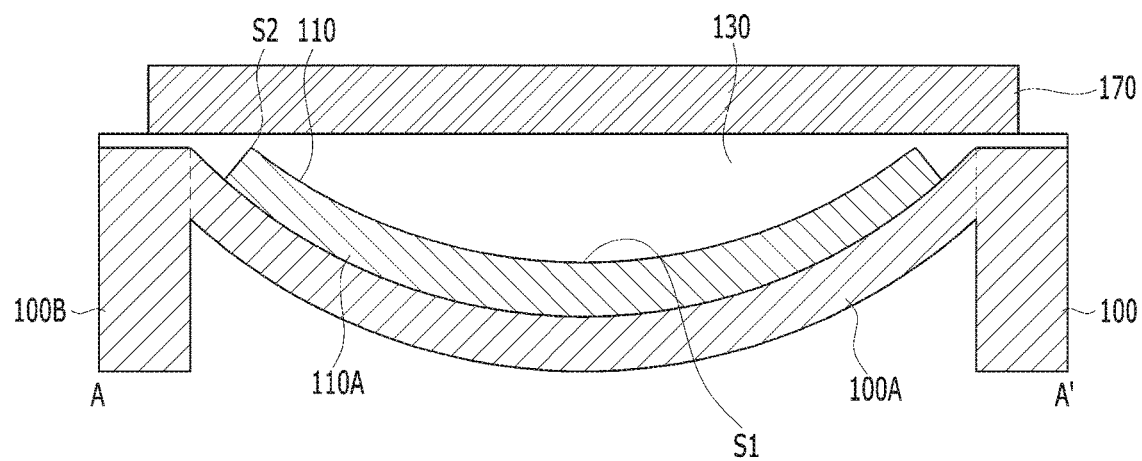

FIGS. 5A and 5B are diagrams illustrating an example of the curved image sensor in accordance with an embodiment of the present invention. Specifically, FIGS. 5A and 5B show an integrated form of an infrared cut-off filter 170 formed over the flare ghost preventive film 130 and the curved image sensor.

The image sensor chip 110 may be formed to cover the upper portion of the supporting portion 100B of the supporting substrate 100, and the upper surface of the flare ghost preventive film 130 may be formed at the same level as the upper surface S2 of the image sensor chip 110.

The infrared cut-off filter 170 may be formed of a material having a higher refractive index than that of the flare ghost preventive film 130. For example, the infrared cut-off filter 170 may be formed of glass, which has a refractive index of approximately 1.5, to contact the upper portion of the flare ghost preventive film 130. In this way, the process of fabricating an electronic device including the curved image sensor in accordance with the embodiment of the present invention may be simplified, reducing the production costs.

Also, since an air layer is not formed between the infrared cut-off filter 170 and the flare ghost preventive film 130 in the example of the curved image sensor, the number of media through which the incident light passes may be decreased less than when the incident light passes through an air layer. In this way, the optical characteristics of the incident light may be improved.

FIG. 5B is an example of the curved image sensor. Specifically, FIG. 5B shows an integrated form of the infrared cut-off filter 170 and the curved image sensor by forming the infrared cut-off filter 170 in the upper portion of the flare ghost preventive film 130.

The image sensor chip 110 may be formed to have its upper surface at the same level as or at a lower level than the upper surface of the curved portion 100A of the supporting substrate 100.

Also, the flare ghost preventive film 130 may be formed to cover the upper portion of the supporting substrate 100 where the image sensor chip 110 is not formed. The image sensor chip 110 may be formed to have its upper surface at the same level as or at a lower level than the upper surface of the curved portion 100A of the supporting substrate 100.

Also, the flare ghost preventive film 130 of FIGS. 5A and 5B may be formed of a thermosetting material which has transparency with respect to visible light and has a higher refractive index than that of the atmosphere. According to an embodiment of the present invention, the flare ghost preventive film 130 may be formed of a thermosetting material having a refractive index that is higher than that of the air, but lower than that of the infrared cut-off filter 170. For example, the flare ghost preventive film 130 may include a polyimide, polystyrene, or polyhydroxy styrene-based material.

The curved image sensor in accordance with the embodiment of the present invention may be applied to diverse electronic devices or systems. Hereafter, an example in which the curved image sensor in accordance with the embodiment of the present invention is applied to a camera is described by referring to FIG. 6.

Figure 6:
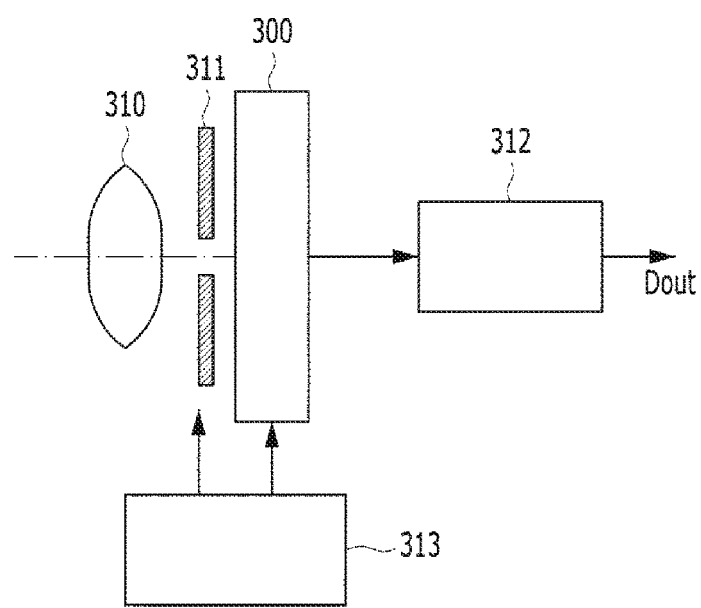
FIG. 6 is a diagram illustrating an electronic device including the curved image sensor in accordance with the embodiment of the present invention.

FIG. 6 illustrates an electronic device including the curved image sensor in accordance with the embodiment of the present invention.

Referring to FIG. 6, the electronic device to which the curved image sensor in accordance with the embodiment of the present invention is applied may be a camera capable of capturing still images or moving pictures. The electronic device may include a curved image sensor 300, an optical system (or an optical lens) 310, a shutter unit 311, a driving unit 313 for controlling/driving the curved image sensor 300 and the shutter unit 311, and a signal processing unit 312.

The optical system 310 may guide an image light (i.e., incident light) from a subject to a pixel array (refer to the pixel array 2 of FIG. 1) of the curved image sensor 300. The optical system 310 may include a plurality of optical lenses. The shutter unit 311 may control a light radiation time and a light shutting time for the curved image sensor 300. The driving unit 313 may control a transmission operation of the curved image sensor 300 and a shutting operation of the shutter unit 311. The signal processing unit 312 may process diverse kinds of signals for the signals outputted from the curved image sensor 300. Image signals Dout after the signal processing may be stored in a storage medium, such as a memory, or outputted onto a monitor.

According to the embodiments of the present invention, the curved image sensor may prevent the flare ghost phenomenon by providing a flare ghost preventive film having a planar upper surface so as to prevent reflected light from going back into the inside of an image sensor chip.

The flare ghost preventive film in accordance with the embodiments of the present invention may maintain the curved shape of the image sensor chip by being formed over the curved upper surface of the image sensor chip to have the same curvature as that of the upper surface of the image sensor chip. Also, since the flare ghost preventive film is formed filling the image sensor chip from lowermost upper surface to the uppermost upper surface with a material having thermosetting characteristics, the flare ghost preventive film may maintain the curved shape of the image sensor chip more effectively.

The curved image sensor in accordance with the embodiments of the present invention may increase the light gathering power of incident lights entering the image sensor chip and increase the optical characteristics by forming the flare ghost preventive film of a material having a higher refractive index than that of the atmosphere and forming the flare ghost preventive film to have transparency with respect to visible lights.

While the present invention has been described with respect to the specific embodiments, it will be apparent to those skilled in the art that various changes and modifications may be made without departing from the spirit and scope of the invention as defined in the following claims.

What is claimed is:

1. A curved image sensor, comprising:
   a supporting substrate;
   an image sensor chip formed over the supporting substrate and including a curved light incidence surface; and
   a flare ghost preventive film formed over the curved light incidence surface and including a planar upper surface.

2. The curved image sensor of claim 1, wherein a lower surface of the flare ghost preventive film has the same curvature as a curvature of an upper surface of the image sensor chip.

3. The curved image sensor of claim 1, wherein the flare ghost preventive film fills the image sensor chip from a lowermost upper surface to an uppermost upper surface.

4. The curved image sensor of claim 1, wherein the flare ghost preventive film includes a material whose refractive index is higher than a refractive index of atmosphere.

5. The curved image sensor of claim 1, wherein the flare ghost preventive film includes a thermosetting material.

6. The curved image sensor of claim 1, wherein the supporting substrate includes:
   a curved portion where the image sensor chip is formed and a center is concavely curved; and
   a supporting portion that contacts both sidewalls on outskirt of the curved portion.

7. The curved image sensor of claim 6, wherein the image sensor chip is formed over a portion of the supporting portion and the curved portion.

8. The curved image sensor of claim 6, wherein the flare ghost preventive film is formed over a portion of the curved portion and the image sensor chip.

9. The curved image sensor of claim 6, wherein the flare ghost preventive film covers an upper portion of the supporting substrate where the image sensor chip is formed.

10. A curved image sensor, comprising:
    an image sensor chip including a curved light incidence surface;
    a flare ghost preventive film covering the curved light incidence surface and including a planar upper surface; and
    an infrared cut-off filter formed to contact the planar upper surface of the flare ghost preventive film.

11. The curved image sensor of claim 10, further comprising:
    a supporting substrate formed in a lower portion of the image sensor chip and concavely curved,
    wherein the supporting substrate includes:
    a curved portion where the image sensor chip is formed and a center is concavely curved; and
    a supporting portion contacting both side a Is on outskirt of the curved portion.

12. The curved image sensor of claim 11, wherein the image sensor chip is formed over a portion of the supporting portion and the curved portion.

13. The curved image sensor of claim 11, wherein the flare ghost preventive film is formed over a portion of the curved portion and the image sensor chip.

14. The curved image sensor of claim 11, wherein the flare ghost preventive film covers an upper portion of the supporting substrate where the image sensor chip is formed.

15. The curved image sensor of claim 10, wherein a refractive index of the infrared cut-off filter is higher than a refractive index of the flare ghost preventive film.

16. The curved image sensor of claim 10, wherein a surface of a lower portion of the flare ghost preventive film adheres to the curved light incidence surface of the image sensor chip, and the curved light incidence surface of the image sensor chip is fixed by the flare ghost preventive film.

17. The curved image sensor of claim 10, wherein the flare ghost preventive film includes a thermosetting material.

18. The curved image sensor of claim 10, wherein the flare ghost preventive film fills the curved light incidence surface of the image sensor chip from a lowermost surface to an uppermost surface.

19. The curved image sensor of claim 10, wherein a refractive index of the flare ghost preventive film is higher than a refractive index of atmosphere and lower than a refractive index of the infrared cut-off filter.

* * * * *